United States Patent
Wu et al.

(10) Patent No.: US 10,784,373 B1
(45) Date of Patent: Sep. 22, 2020

(54) INSULATED GATED FIELD EFFECT TRANSISTOR STRUCTURE HAVING SHIELDED SOURCE AND METHOD

(71) Applicant: SEMICONDUCTOR COMPONENTS INDUSTRIES, LLC, Phoenix, AZ (US)

(72) Inventors: Xiaoli Wu, Shanghai (CN); Joseph Andrew Yedinak, Mountain Top, PA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/515,334

(22) Filed: Jul. 18, 2019

Related U.S. Application Data

(60) Provisional application No. 62/818,178, filed on Mar. 14, 2019.

(51) Int. Cl.
*H01L 29/78* (2006.01)
*H01L 27/07* (2006.01)
*H01L 29/10* (2006.01)

(52) U.S. Cl.
CPC ...... *H01L 29/7835* (2013.01); *H01L 27/0727* (2013.01); *H01L 29/1045* (2013.01)

(58) Field of Classification Search
CPC ............. H01L 29/7835; H01L 29/1045; H01L 27/0727
See application file for complete search history.

(56) References Cited

U.S. PATENT DOCUMENTS

| | | |
|---|---|---|
| 5,510,278 A | 4/1996 | Nguyen et al. |
| 5,895,952 A * | 4/1999 | Darwish ............. H01L 29/7813 257/330 |
| 5,998,837 A | 12/1999 | Williams |
| 6,664,594 B2 | 12/2003 | Klodzinski |
| 6,798,019 B2 | 9/2004 | Yedinak et al. |
| 7,405,128 B1 | 7/2008 | Khemka et al. |

(Continued)

FOREIGN PATENT DOCUMENTS

WO 2006136979 A2 12/2006

*Primary Examiner* — Victor A Mandala
(74) *Attorney, Agent, or Firm* — Kevin B. Jackson

(57) ABSTRACT

A semiconductor device includes a region of semiconductor material comprising a semiconductor layer of a first conductivity type and having a first major surface. A body region of a second conductivity type opposite to the first conductivity type is disposed in the second semiconductor layer extending from the first major surface. The body region comprises a first segment having a first doping concentration, and a second segment laterally adjacent to the first segment and adjacent to the first major surface having a second doping concentration less than the first doping concentration. A source region of the first conductivity type is disposed in the first segment but is not disposed in at least a portion of the second segment. An insulated gate electrode is disposed adjacent to the region of semiconductor material adjoining the first segment, the second segment, and the source region. A conductive layer is electrically connected to the first segment, the second segment, and the first source region. During a linear mode of operation, current flows first in the second segment but not in the first segment to reduce the likelihood of thermal runaway.

20 Claims, 8 Drawing Sheets

(56) References Cited

U.S. PATENT DOCUMENTS

| | | | |
|---|---|---|---|
| 8,034,685 B1 | 10/2011 | Venkatraman et al. | |
| 10,355,078 B2* | 7/2019 | Kono | H01L 29/063 |
| 2002/0019099 A1 | 2/2002 | Williams et al. | |
| 2002/0125527 A1* | 9/2002 | Blanchard | H01L 29/41766 |
| | | | 257/328 |
| 2003/0160270 A1 | 8/2003 | Pfirsch et al. | |
| 2007/0290257 A1 | 12/2007 | Kraft et al. | |
| 2010/0330767 A1 | 12/2010 | Lui et al. | |
| 2012/0058607 A1* | 3/2012 | Parthasarathy | H01L 29/66333 |
| | | | 438/138 |
| 2013/0026559 A1* | 1/2013 | Arthur | H01L 29/7802 |
| | | | 257/329 |
| 2016/0035867 A1* | 2/2016 | Pfirsch | H01L 29/407 |
| | | | 257/140 |
| 2017/0047443 A1* | 2/2017 | Meiser | H01L 29/1083 |
| 2018/0025910 A1* | 1/2018 | Ohashi | H01L 29/1095 |
| | | | 257/77 |
| 2018/0182886 A1* | 6/2018 | Kobayashi | H01L 29/7813 |
| 2019/0074373 A1* | 3/2019 | Kobayashi | H01L 29/7811 |
| 2019/0259842 A1* | 8/2019 | Basler | H01L 29/0878 |
| 2019/0259863 A1* | 8/2019 | Bina | H01L 29/861 |
| 2019/0305124 A1* | 10/2019 | Watanabe | H01L 29/205 |

* cited by examiner

INSULATED GATED FIELD EFFECT TRANSISTOR STRUCTURE HAVING SHIELDED SOURCE AND METHOD

CROSS REFERENCE TO RELATED APPLICATION

This application claims the benefit of U.S. Provisional Patent Application No. 62/818,178, filed on Mar. 14, 2019, the entire contents of which is incorporated herein by reference.

BACKGROUND

This document relates generally to semiconductor devices and, more specifically, to insulated gate device structures and methods.

Insulated gate field effect transistors (IGFETs), such as metal oxide semiconductor field effect transistors (MOSFETs), have been used in many power switching applications, such as dc-dc converters. In a typical MOSFET, a gate electrode provides turn-on and turn-off control with the application of an appropriate gate voltage. By way of example, in an n-type enhancement mode MOSFET, turn-on occurs when a conductive n-type inversion layer (i.e., channel region) is formed in a p-type body region in response to the application of a positive gate voltage, which exceeds an inherent threshold voltage. The inversion layer connects n-type source regions to n-type drain regions and allows for majority carrier conduction between these regions.

The Safe Operating Area or "SOA" of an IGFET device is defined as the voltage and current conditions over which the device can be expected to operate without self-damage. In general, there are three operating conditions often referred to in typical enhancement mode IGFET current-voltage output characteristics: a) a fully turned-on condition where the gate-to-source voltage ($V_{GS}$) is biased well above the threshold voltage ($V_T$) and a good conduction channel region connects the source and drain regions (a characteristic where the drain-source voltage ($V_{DS}$) is low and drain-source current ($I_{DS}$) is high); b) an off condition where $V_{GS} < V_T$ and no channel region is formed (a characteristic where $V_{DS}$ is high and $I_{DS}$ is essentially zero); and c) a condition between a and b where the channel region is pinched-off referred to as a linear mode or constant current condition where neither $V_{DS}$ or $I_{DS}$ are low.

When an IGFET device functions in the linear mode of operation, junction temperature ($T_J$) increases due to high power dissipation through the device because neither $V_{DS}$ nor $I_{DS}$ are low. With the increase of junction temperature at certain gate biases below what is referred to as the zero temperature coefficient point, the $I_{DS}$ current will increase causing the junction temperature to further increase. This positive feedback effect can result in a thermal runaway condition resulting in device failure. This effect can be exasperated by localized current hot-spots within a device caused by, for example, localized defects, process variations, or bonding wire placement. In addition, with the continued industry push to reduce on-resistance, smaller pitched devices have been developed to meet the reduced on-resistance demand. However, the change in current with respect to change in temperature or dI/dT is increased in smaller pitched devices, thus exacerbating the thermal runaway condition during the linear mode of operation.

Accordingly, structures and methods are needed that improve the ability of semiconductor devices, such as IGFET devices to operate under linear mode conditions. It would be beneficial for the structure and method to be cost effective and to minimize effect on other device operating parameters.

BRIEF SUMMARY

The present description includes, among other features, a structure and method for improving the operation of a semiconductor device, such as an insulated gate field effect transistor (IGFET) device, which includes a power metal oxide semiconductor FET (MOSFET) device, in a linear mode of operation where higher power dissipation occurs. Specifically, a structure and method is provided where during linear mode of operation the channel current is configured to flow only in certain segments of the device. In some examples, the structure comprises a source region of a first conductivity type having a first segment bounded underneath by a first segment of well region of a second conductivity type. In some examples, the first segment of the source region is laterally bounded by a second segment of the well region where the dopant concentration of the second segment of the well region is less than the dopant concentration of the first segment of the well region. In operation, the second segment of the well region has a lower threshold voltage $V_T$ than the first segment of the well region and turns on first facilitating the lateral and vertical current flow in the device. During the linear mode of operation, a channel is not formed in the first segment of the well region, which functions to shield the first segment of the source region from vertical current flow to reduce the likelihood of thermal runaway.

In some examples, a second segment of the source region is configured to provide a series ballast resistance to provide a negative feedback between current and junction temperature in the linear mode of operation (i.e., as temperature increases the series resistance increases thereby reducing current through the ballast resistor portion of the source region), which improves current uniformity across the device thus improving the forward-biased safe operating area (FBSOA). In addition, the first segment of the well region having the increased dopant concentration functions to improve on-resistance when the device is in a fully-on condition.

More particularly, in one example, a semiconductor device structure comprises a region of semiconductor material comprising a first semiconductor layer of a first conductivity type and having a first major surface. A first body region of a second conductivity type opposite to the first conductivity type is disposed in the first semiconductor layer extending from the first major surface. The first body region comprises a first segment having a first doping concentration, and a second segment laterally adjacent to the first segment and adjacent to the first major surface having a second doping concentration less than the first doping concentration. A first source region of the first conductivity type is disposed in the first segment of the body region but is not disposed in at least a portion of the second segment. An insulated gate electrode is disposed adjacent to the region of semiconductor material adjoining the first segment, the second segment, and the first source region. A first conductive layer is electrically connected to the first segment, the second segment, and the first source region. A second conductive layer adjacent to a second major surface of the region of semiconductor material opposite to the first major surface. In another example, the structure can include a ballast resistor structure electrically connected to the first source region, wherein the ballast resistor structure does not physically contact the first conductive layer.

In a further example, the first body region comprises a first stripe region; and the semiconductor device structure further includes a second body region comprising a second stripe region generally parallel to the first stripe region; a second body region first segment having the first doping concentration; and a second body region second segment having the second doped concentration; and a second source region of the first conductivity type disposed within the second body region first segment and laterally offset with respect to the first source region.

In a further example, a semiconductor device structure comprises a region of semiconductor material comprising a first semiconductor layer of a first conductivity type and having a first major surface. A first body region of a second conductivity type opposite to the first conductivity type is disposed in the first semiconductor layer extending from the first major surface, wherein the first body region comprises a first body region first segment having a first doping concentration; and a first body region second segment laterally adjacent to the first body region first segment and adjacent to the first major surface having a second doping concentration less than the first doping concentration. A first source region of the first conductivity type is disposed in the first body region first segment but not disposed in at least a portion of the first body region second segment. An insulated gate electrode is disposed adjacent to the region of semiconductor material adjoining the first body region first segment, the first body region second segment, and the first source region. A first conductive layer is disposed in a contact trench and electrically connected to the first body region first segment, the first body region second segment, and the first source region. In a still further example, the first body region first segment extends into the first semiconductor layer to a first depth, and the first body region second segment extends into the first semiconductor layer to a second depth that is different than the first depth.

In another example, the first doping concentration has a first peak dopant concentration, the second doping concentration has a second peak dopant concentration, and the first peak dopant concentration is at least twice the second peak dopant concentration.

In a further example, a method of forming a semiconductor device structure includes providing a region of semiconductor material comprising a first semiconductor layer of a first conductivity type and having a first major surface. The method includes providing a first body region of a second conductivity type opposite to the first conductivity type disposed in the first semiconductor layer extending from the first major surface, wherein the first body region includes a first body region first segment having a first doping concentration, and a first body region second segment laterally adjacent to the first body region first segment and adjacent to the first major surface having a second doping concentration less than the first doping concentration. The method includes providing a first source region of the first conductivity type disposed in the first body region first segment but not disposed in at least a portion of the first body region second segment. The method includes providing an insulated gate electrode disposed within the region of semiconductor material adjoining the first body region first segment, the first body region second segment, and the first source region. The method includes providing a first conductive layer disposed in a contact trench and electrically connected to the first body region first segment, the first body region second segment, and the first source region.

In a further example, the method further includes providing a ballast resistor structure electrically connected to the first source region, wherein the ballast resistor structure does not physically contact the first conductive layer; and the ballast resistor structure comprises a doped region of the first conductivity type disposed within the first body region second segment and laterally extends to overlap a portion of the first body region first segment.

Other examples are included in the present disclosure. Such examples may be found in the figures, in the claims, and/or in the description of the present disclosure.

Figure 1:
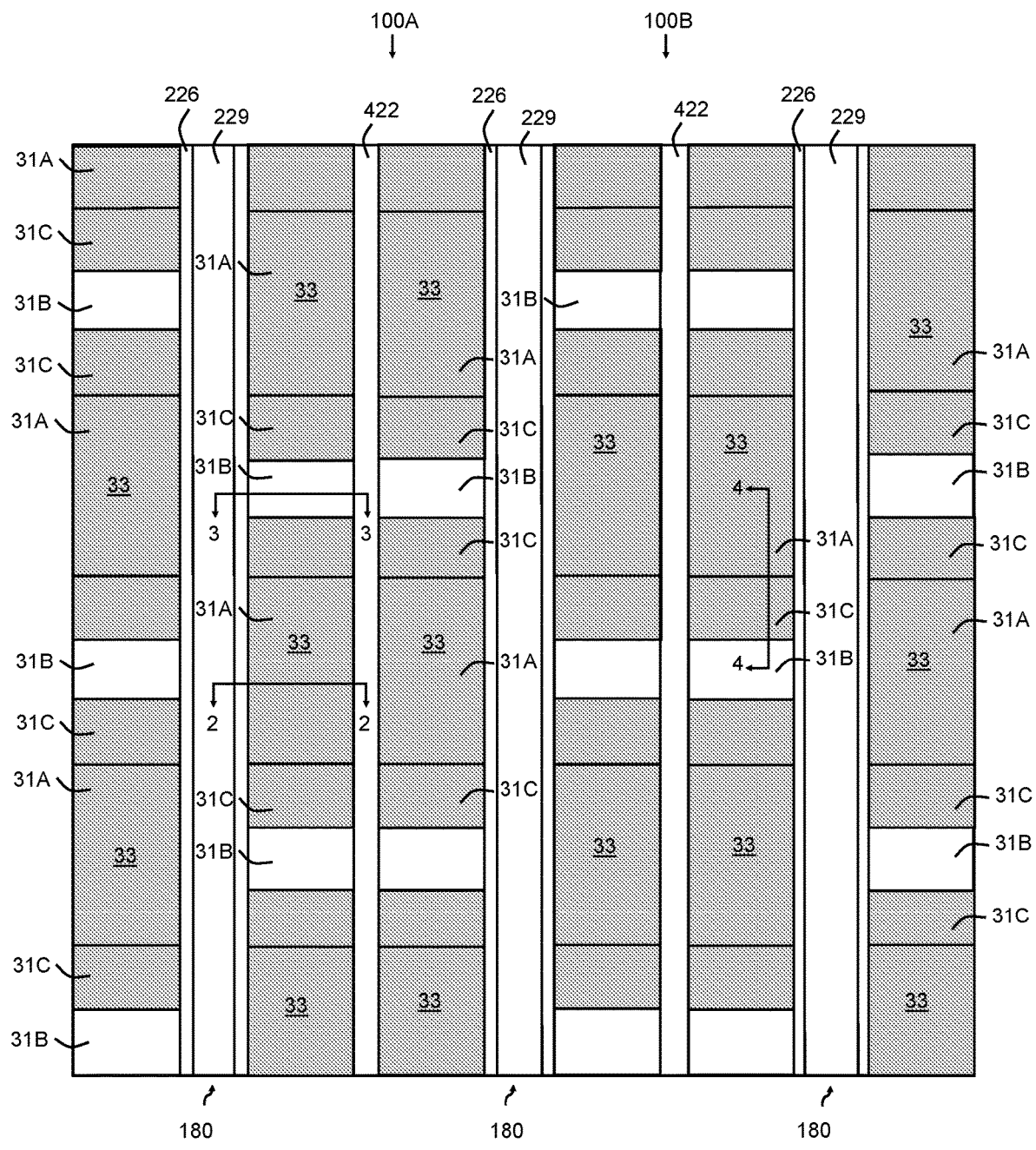
FIG. 1 illustrates a partial top plan view of a semiconductor device in accordance with the present description.

For simplicity and clarity of the illustration, elements in the figures are not necessarily drawn to scale, and the same reference numbers in different figures denote the same elements. Additionally, descriptions and details of well-known steps and elements are omitted for simplicity of the description. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term major surface when used in conjunction with a semiconductor region, wafer, or substrate means the surface of the semiconductor region, wafer, or substrate that forms an interface with another material, such as a dielectric, an insulator, a conductor, or a polycrystalline semiconductor material. The major surface can have a topography that changes in the x, y and z directions. As used herein, the term and/or includes any and all combinations of one or more of the associated listed items. In addition, the terminology used herein is for the purpose of describing particular examples only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. It will be appreciated by those skilled in the art that words, during, while, and when as used herein related to circuit operation are not exact terms that mean an action takes place instantly upon an initiating action but that there may be some small but reasonable delay, such as propagation delay, between the reaction that is initiated by the initial action. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. Unless specified otherwise, as used herein the word overlapping includes orientations, placements, or relations where the specified elements can at least partly or wholly coincide or align in the same or different planes. It is further understood that the examples illustrated and described hereinafter suitably may have examples and/or may be practiced in the absence of any element that is not specifically disclosed herein.

DETAILED DESCRIPTION OF THE DRAWINGS

Figure 2:
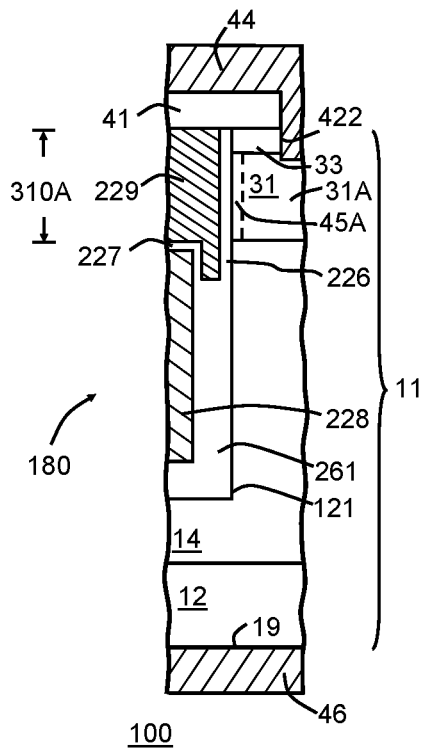
FIG. 2 illustrates a partial cross-sectional view of the semiconductor device of FIG. 1 taken along reference line 2-2.
Figure 3:
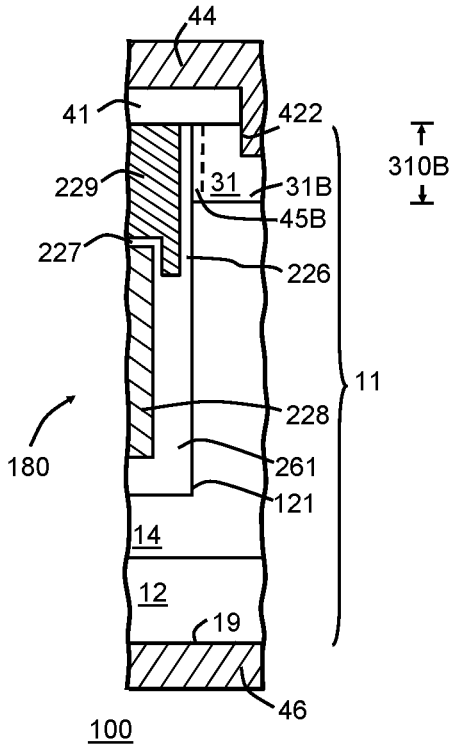
FIG. 3 illustrates a partial cross-sectional view of the semiconductor device of FIG. 1 taken along reference line 3-3.
Figure 4:
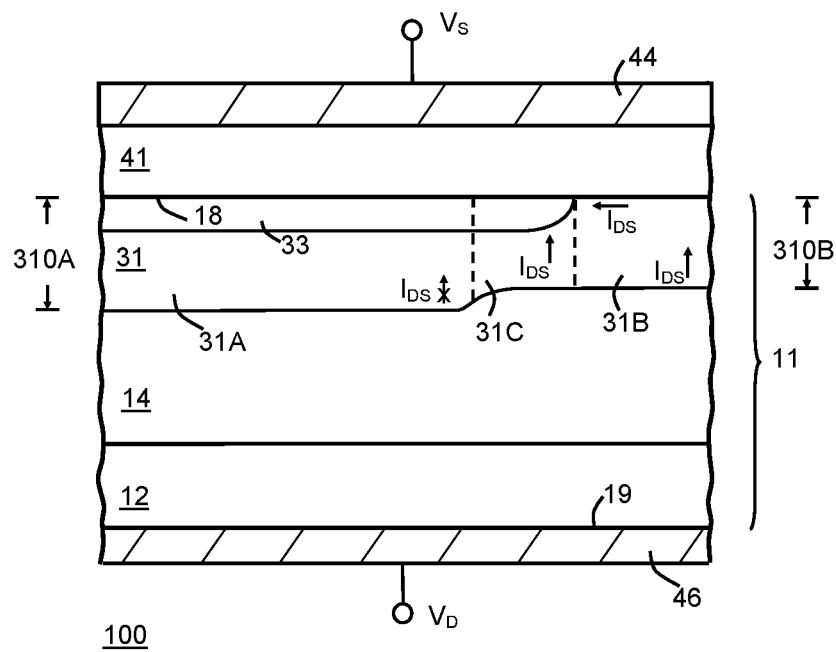
FIG. 4 illustrates a partial cross-sectional view of the semiconductor device of FIG. 1 taken along reference line 4-4.

FIG. 1 illustrates a partial top plan view of an electronic device 100, semiconductor device structure 100, or semiconductor device 100 in accordance with an example of the present description. FIG. 2 illustrates a partial cross-sectional view of semiconductor device 100 taken along reference line 2-2 of FIG. 1, FIG. 3 illustrates a partial cross-sectional view of semiconductor device 100 taken along reference line 3-3 of FIG. 1, and FIG. 4 illustrates a partial cross-sectional view of semiconductor device 100 taken along reference line 4-4 of FIG. 1. For ease of understanding of the present description, in FIG. 1 semiconductor device 100 is illustrated without inter-layer dielectric layer 41 and without conductive layer 44, which are illustrated in FIGS. 2, 3, and 4.

Semiconductor device 100 includes a region of semiconductor material 11, semiconductor substrate 11, or semiconductor region 11, which can include, for example, an N-type conductivity silicon substrate 12 having a resistivity ranging from about 0.001 ohm-cm to about 0.005 ohm-cm. By way of example, substrate 12 can be doped with phosphorous, arsenic, or antimony. In the example illustrated, substrate 12 provides a drain region, drain contact, or a first current carrying contact for semiconductor device 100. In this example, semiconductor device 100 can be formed in an active area 102 of a semiconductor chip or die. Termination structures as well as gate and shield electrode contacts are typically made in a peripheral area of semiconductor device 100, which are not shown herein. In this example, semiconductor device 100 is configured as a vertical power MOSFET structure, but the present description applies as well to insulated gate bipolar transistors (IGBTs), MOS-gated thyristors, and other related or equivalent structures as known by one of ordinary skill in the art. Region of semiconductor material 11 includes a major surface 18 and an opposing major surface 19.

Semiconductor device 100 further includes a semiconductor layer 14, drift region 14, or extended drain region 14 formed in, on, partially within, or overlying substrate 12. In some examples, semiconductor layer 14 can be formed using semiconductor epitaxial growth techniques. Alternatively, semiconductor layer 14 can be formed using semiconductor doping and diffusion techniques. In an example suitable for a 50 volt device, semiconductor layer 14 can be N-type conductivity with a dopant concentration of about $1.0 \times 10^{16}$ atoms/cm$^3$ to about $1.0 \times 10^{17}$ atoms/cm$^3$, and can have a thickness from about 3 microns to about 5 microns. The dopant concentration and thickness of semiconductor layer 14 can be increased or decreased depending on the desired drain-to-source breakdown voltage ($BV_{DSS}$) rating of semiconductor device 100. In other examples, semiconductor layer 14 can have a graded dopant profile where the dopant concentration varies by increasing or decreasing along the thickness of semiconductor layer 14. Semiconductor layer 14 provides a drift region for semiconductor device 100 and is configured to allow current flow in the on mode of operation and to withstand an applied drain-to-source voltage in the off mode of operation.

In an alternate example, the conductivity type of substrate 12 can be opposite to the conductivity type of semiconductor layer 14 (e.g., substrate 12 can be P-type conductivity) to form, for example, an IGBT embodiment. Also, it is contemplated that other materials can be used for region of semiconductor material 11 or portions thereof including silicon-germanium, silicon-germanium-carbon, carbon-doped silicon, silicon carbide, gallium nitride, or other related or equivalent materials as known by one of ordinary skill in the art.

In the present example and as illustrated in FIGS. 2 and 3, semiconductor device 100 includes an insulated gate electrode 180 or insulated gate structure 180, which in some examples can comprise a shielded gate structure including a trench structure 121 or trench 121 extending from major surface 18 into region of semiconductor material 11. By way of example, trench 121 can be etched using plasma etching techniques with a fluorocarbon chemistry or a fluorinated chemistry (for example, $SF_6/O_2$) or other chemistries or removal techniques as known to those of ordinary skill in the art. A shield dielectric layer 261 is disposed along lower surfaces of trench 121 and functions to isolate a shield electrode 228 from region of semiconductor material 11. In some examples, shield dielectric layer 261 comprises one or more dielectric or insulative materials. By way of example, shield dielectric layer 261 comprises about 0.1 microns or more of thermal oxide. In other examples, shield dielectric layer 261 can comprise one or more deposited dielectric materials. In some examples, shield electrode 228 comprises a doped polycrystalline semiconductor material, such as doped polysilicon. In some examples, shield electrode 228 can be doped with an N-type conductivity dopant, such as phosphorous or arsenic. Shield electrode 228 functions, among other things, with other features of semiconductor device 100 to provide charge balancing to reduce on-resistance.

An inter-electrode dielectric layer 227 is disposed to overly shield electrode 228, and a gate dielectric layer 226 is disposed along upper sidewall surfaces of trench 121. Gate layer 226 and inter-electrode dielectric layer 227 can be oxides, nitrides, tantalum pentoxide, titanium dioxide, barium strontium titanate, high k dielectric materials, combinations thereof, or other related or equivalent materials known by one of ordinary skill in the art. In one example, gate dielectric layer 226 and inter-electrode dielectric layer 227 can be silicon oxide. In some examples, gate dielectric layer 226 can have a thickness from about 0.04 microns to about 0.1 microns, and inter-electrode dielectric layer 227 can have a thickness that is greater than that of gate dielectric layer 226. In some examples, shield dielectric layer 261 can have a greater thickness than gate dielectric layer 226 and inter-electrode dielectric layer 227.

A gate electrode 229 is disposed adjoining gate dielectric layer 226, and in some examples comprises a doped polycrystalline semiconductor material, a conductive material, or combinations of both. In some examples, gate electrode 229 comprises polysilicon doped with an N-type dopant, such as phosphorous or arsenic. Shield electrode 228 and gate electrode 229 can be formed using chemical vapor deposition (CVD) processing techniques, and can be doped in-situ as part of the CVD process or subsequently using, for example, ion implantation and annealing processing techniques. Gate electrode 229 functions to control the formation of channel regions in semiconductor device 100.

Semiconductor device 100 further comprises a body region 31, base region 31, or well region 31 disposed within region of semiconductor material 11 and extends inward into semiconductor layer 14 from major surface 18. Body region 31 comprises an opposite conductivity type to semiconductor layer 14, and in the present example, comprises a P-type conductivity dopant, such as boron. Body region 31 can be formed using ion implantation and annealing process techniques or other doping techniques as known to those of ordinary skill in the art.

In accordance with the present description, body region 31 comprises a plurality of segments or regions along its lateral extent or lateral dimension that have different doping concentrations. More particularly, body region 31 can be configured having a stripe-shape with a laterally-segmented body region structure, a multi-segment body region structure, or a multi-portion body region structure. In some examples, body region 31 comprises a first segment 31A and a second segment 31B. In some examples, body region 31 further includes a third segment 31C, which is laterally disposed in between first segment 31A and 31B.

In accordance with the present description, first segment 31A has a higher dopant concentration than second segment 31B, and first segment 31A can extend into region of semiconductor material 11 to a depth 310A that is greater than a depth 310B of second segment 31B. In some examples, depth 310A is in a range from about 0.5 microns through about 2.0 microns and depth 310B is in a range from about 0.5 microns through about 2.0 microns. In some examples, depth 310A and depth 310B can be equal depending on the gate length, but in most examples, depth 310A and depth 310B are shallower than gate electrode 229. First segments 31A can also be referred to as high or higher concentration regions 31A, and second segments 31B can be referred to as low or lower concentration regions 31B.

In some examples, first segment 31A has a peak dopant concentration that is about twice or 2× that of second segment 31B. The difference depends in some examples on the defined threshold voltage ($V_T$) requirements of first segment 31A, which depends on a desired SOA vs. $R_{dson}$ tradeoff. In other examples, first segment 31A has a peak dopant concentration that about 1.75× that of second segment 31B. In further examples, first segment 31A has a peak dopant concentration that is about 1.5× that of second segment 31B. In still further examples, first segment 31A has a peak dopant concentration that is about 1.25× or more than that of second segment 31B. When used, third segment 31C can have a dopant concentration in between first segment 31A and second segment 31B, and can be configured as a transition region between first segment 31A and second segment 31B. In other examples, third segment 31C can have a dopant concentration similar to second segment 31B.

The dopant concentration of body region 31 determines the threshold voltage ($V_T$) applied to gate electrode 229 in which an inversion layer forms that operates as a conduction channel for semiconductor device 100. In the present example, a first channel region 45A or channel 45A forms within first segment 31A at a first threshold voltage, and a second channel region 45B or channel 45B forms within second segment 31B at a second threshold voltage that is less than the first threshold voltage. Although not shown, a third channel region forms within third segment 31C at a third threshold voltage that is between the first threshold voltage and the second threshold voltage. As will be described in more detail later, the doping concentrations of first segment 31A and second segment 31B are selected such that channel region 45B forms during a linear mode of operation of semiconductor device while channel region 45A does not form in first segment 31A at the selected gate bias. In this way, vertical conduction does not occur in first segment 31A during the linear mode of operation.

The individual stripe portions of body region 31 can be connected along one or more ends to other striped portions to provide a common base structure. In other examples, the stripe portions can be separated regions. In some examples, depth 310A of first segment 31A is such that the junction formed between first segment 31A and semiconductor layer 14 is less than or proximate to the lower extent of gate electrode 229. In some examples, third segment 31C can have a similar depth as second segment 31B. In other examples, third segment 31C can have a depth in between first segment 31A and second segment 31B.

Source regions 33, current conducting regions 33, or current carrying regions 33 are disposed within, in, or overlying portions of body regions 31 and can extend from major surface 18 to a depth for example, from about 0.2 microns to about 0.4 microns. In some examples, source regions 33 can have N-type conductivity and can be formed using, for example, a phosphorous or arsenic dopant source.

By way of example, ion implantation and annealing processes can be used to form source regions 33 within selected portions of body regions 31 using masking techniques.

In accordance with the present description, source regions 33 are segmented regions (i.e., they are not continuous stripes as in prior devices), and are disposed only within first segments 31A of doped region 31, and, when used, source regions 33 can be further disposed within third segments 31C of doped regions 31. More particularly, source regions 33 are not disposed at least within portion second segments 31B as generally illustrated in FIGS. 1, 3 and 4. Stated differently, all or a portion of second segments 31B are provided absent or without source regions 33. In this way, source regions 33 are shielded by the higher concentration first segment 31A, which cuts-off a vertical current path in a linear mode of operation within first segment 31A. Note that in FIG. 1, segmented source regions 33 are denoted using grey-shading to illustrate that source regions 33 are disposed within first segments 31A and third segments 31C, but not disposed within second segments 31B.

In some examples and as generally illustrated as an example in FIG. 1, first segments 31A and source regions 33 in a first column 100A of semiconductor device 100 are laterally offset from first segments 31A and source regions 33 in an adjoining second column 100B. More particularly, first segments 31A and source regions 33 in first column 100A are staggered with respect to first segments 31A and source regions 33 in adjoining column 100B, which was found unexpectedly to help reduce the impact of the shielded source configuration on on-resistance for semiconductor device 100.

In some examples, semiconductor device 100 further includes layer or layers 41 disposed overlying major surface 18. By way of example, layer 41 comprises one or more dielectric or insulative layers and can be configured as an inter-layer dielectric (ILD) structure to electrically isolate regions of semiconductor device 100 from subsequent interconnect layers. In one example, layer 41 can be a silicon oxide, such as a doped or undoped deposited silicon oxide. In another example, layer 41 can include at least one layer of deposited silicon oxide doped with phosphorous or boron and phosphorous and at least one layer of undoped oxide. Layer 41 can have a thickness from about 0.4 microns to about 1.0 microns. In other examples, layer 41 can be planarized to provide a more uniform surface topography, which improves manufacturability. Layer 41 functions to protect various regions of semiconductor device 100.

In some examples, contact trenches 422 can be formed for making contact to source regions 33 and body region 31 including segments 31A-31C. In one embodiment, a recess etch can be used to remove portions of source regions 33 and doped regions 31 to provide contact trenches 422. The recess etch step can expose portions of body regions 31 below and adjacent to source regions 33. Additionally, a P-type body contact, enhancement region, or contact region (not shown) can be formed in body region 31, which can be configured to provide a lower contact resistance to body region 31. In some examples, contact to source regions 33 occurs primarily along a vertically oriented side surface with contact trenches 422.

A conductive layer 44 can be formed overlying major surface 18, and a conductive layer 46 can be formed overlying major surface 19. Conductive layers 44 and 46 can be configured to provide electrical connection between the individual device components of semiconductor device 100 and a next level of assembly. As stated previously, electrical contact to gate electrode 229 and shield electrodes 228 can be made in a peripheral portion of semiconductor device 100 using, for example, trench contact structures.

In one example, conductive layer 44 can be titanium/titanium-nitride/aluminum-copper or other related or equivalent materials known by one of ordinary skill in the art, and is configured as a source electrode or terminal. In one example, conductive layer 46 can be a solderable metal structure such as titanium-nickel-silver, chromium-nickel-gold, or other related or equivalent materials known by one of ordinary skill in the art and is configured as a drain electrode or terminal. In some examples, a patterned passivation layer (not shown) can be formed overlying conductive layer 44. In other examples, shield electrodes 228 can be connected (for example, using peripheral contact structures) to conductive layer 44, so that shield electrodes 228 are configured to be at the same potential as source regions 33 when semiconductor device 100 is in operation. In other examples, shield electrodes 228 can be configured to be independently biased or can be electrically floating.

In the linear mode of operation of semiconductor device 100 in accordance with the present description, assuming source electrode 44 and shield electrode 228 are operating at a potential $V_S$ of zero volts and gate electrode 229 would receive a control voltage $V_G$ sufficient to form channel 45B in second segments 31B of doped regions 31 (3.0 volts to 5.0 volts in some examples) turning on semiconductor device 100 from an off condition. At this point and in accordance with the present description, the control voltage $V_G$ would not be sufficient to form channels 45A in first segments 31A of doped regions 31. As semiconductor device 100 transitions from the off condition, the drain-to-source voltage ($V_{DS}$) would be initially high (about 50 Volts in some examples) before dropping to a lower voltage once semiconductor device 100 transitions to being fully on. During the linear mode condition, drain current ID would also be high, but would flow first vertically within only second segments 31B through channels 45B and then laterally to source regions 33. In the linear mode of operation, drain current $I_D$ does not flow vertically in first segment 31A since channels 45A have not formed when $V_G$ is less than the $V_T$ of first segments 31A. It is noted that when third segment 31C is used, some vertical conduction may occur in this region once $V_G$ is sufficient to form a channel in third segment 31C or the transition region between first segment 31A and second segment 31B.

In accordance with the present description, because source regions 33 are shielded by first segments 31A of doped region 31 (which have higher doping concentration than second segments 31B of doped regions 31) vertical current flow into shield source regions 33 is reduced or prevented. As a result, the shielded source regions 33 exhibit less of a current increase at higher temperatures. Thus, the intrinsic positive feedback effect between current and temperature observed in prior devices is suppressed. This improves the stability of semiconductor device 100. When semiconductor device 100 is operating in the fully-on mode of operation (i.e., $V_G$ equals the $V_T$ of first segments 31A) channels 45A in first segments 31A of body region 31 are formed and can contribute to current flow thereby reducing any higher on-resistance effects exhibited before channels 45A are formed.

It is understood that the length or size of second segments 31B and first segments 31A/third segments 31C can be different depending the location within semiconductor device 100. That is, the length or size can be different in the center of semiconductor device 100 than at an edge region of semiconductor device 100. For example, the ratio of first segment 31A to second segment 31B can be smaller at the edge region of semiconductor die 100 because temperature effects can be less extreme at the edge region compared to the central portion of semiconductor device 100. As illustrated in FIGS. 1 and 4, source regions 33 can laterally extend beyond first segments 31A of doped region 31. The above noted variables allow for additional fine tuning of semiconductor device 100 to improve performance during the linear mode of operation.

Figure 5:
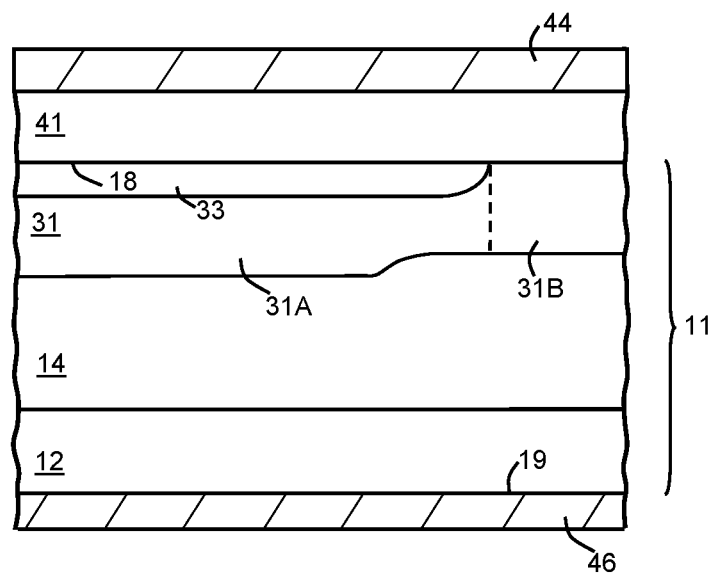
FIG. 5 illustrates a partial cross-sectional view of a semiconductor device in accordance with the present description.
Figure 6:
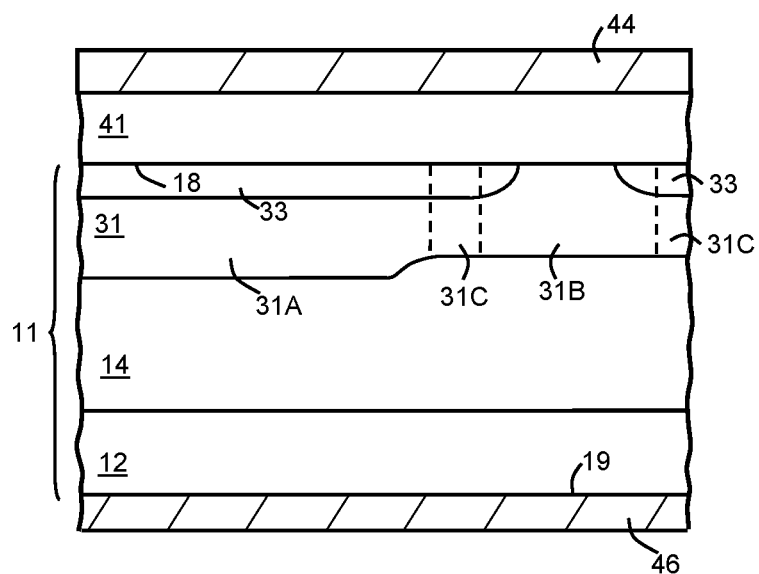
FIG. 6 illustrates a partial cross-sectional view of a semiconductor device in accordance with the present description.

By way of example, FIG. 5 illustrates a partial cross-sectional view of a variation of a semiconductor device in accordance with the present description where third segment 31C is excluded and source region 33 extends up to approximately where second segment 31B starts. By way of further example, FIG. 6 illustrates a partial cross-sectional view of another variation of a semiconductor device in accordance with the present description where third segment 31C is included, first segment 31A has a smaller lateral width, and source regions 33 extend into second segment 31B. It is understood that the examples of FIGS. 5 and 6 can be incorporated as portions of semiconductor device 100 in combination with the examples of FIGS. 1-4.

Figure 7:
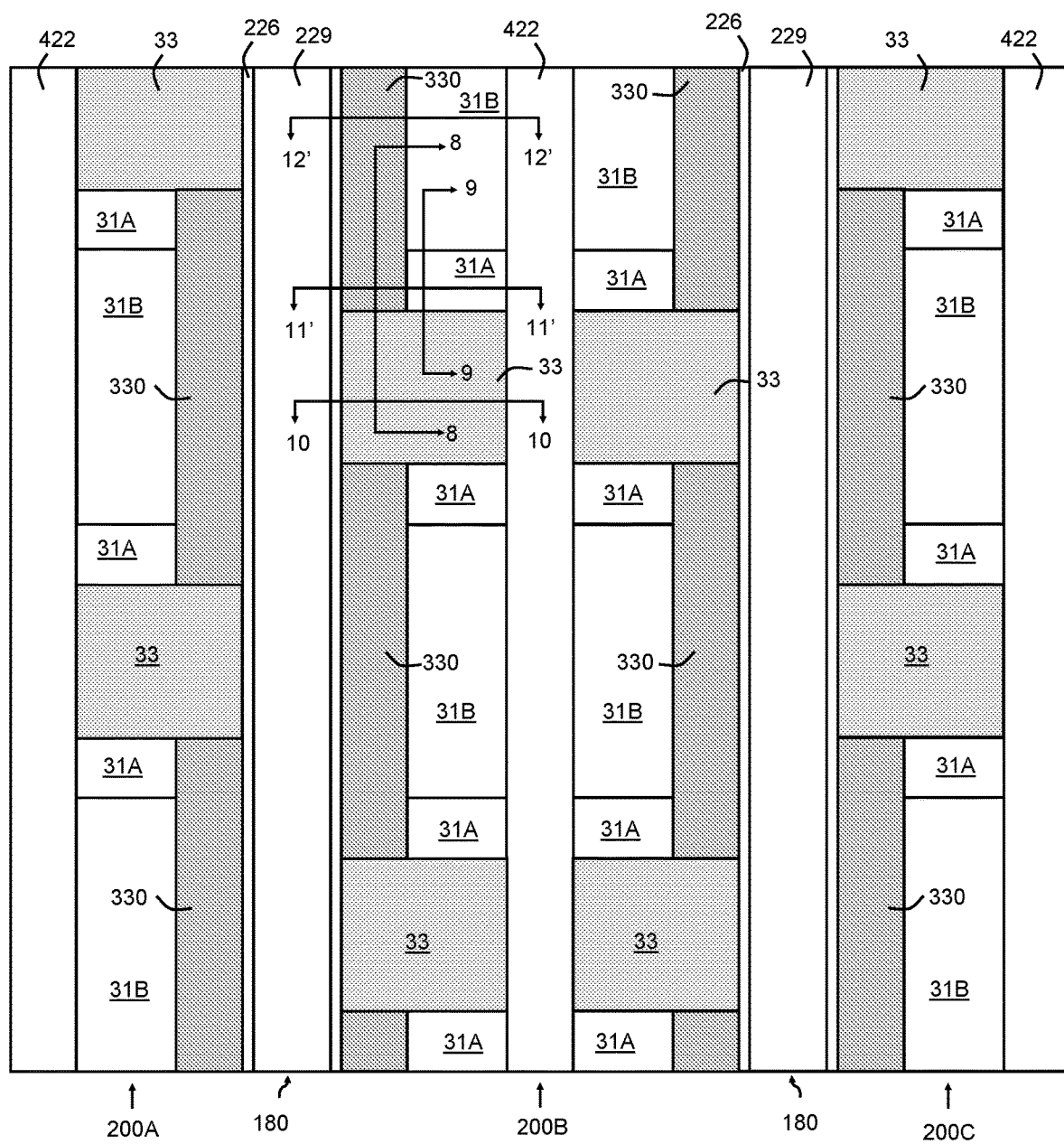
FIG. 7 illustrates a partial top plan view of a semiconductor device in accordance with the present description.
Figure 8:
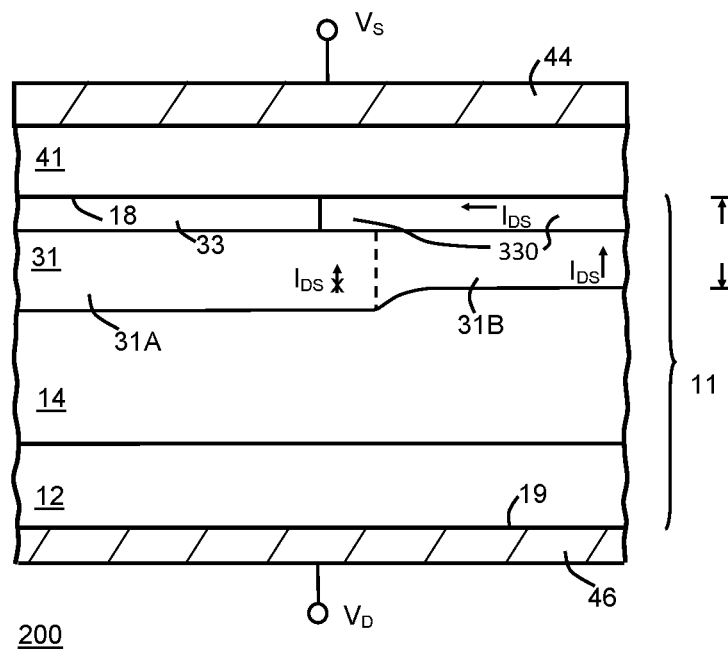
FIG. 8 illustrates a partial cross-sectional view of the semiconductor device of FIG. 7 taken along reference line 8-8.
Figure 9:
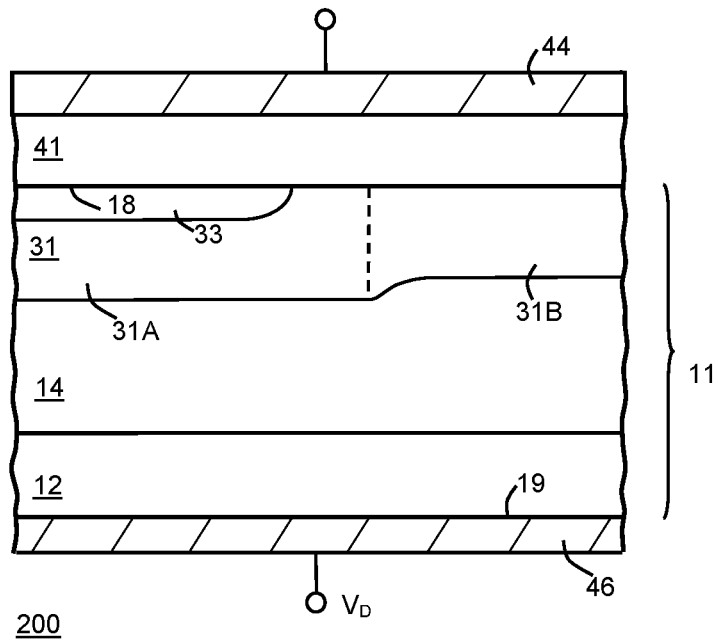
FIG. 9 illustrates a partial cross-sectional view of the semiconductor device of FIG. 7 taken along reference line 9-9.
Figure 10:
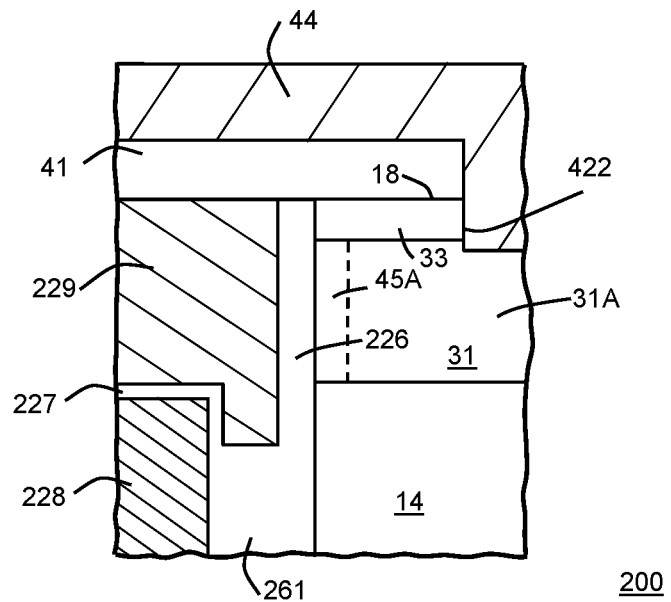
FIG. 10 illustrates a partial cross-sectional view of the semiconductor device of FIG. 7 taken along reference line 10-10.
Figure 11:
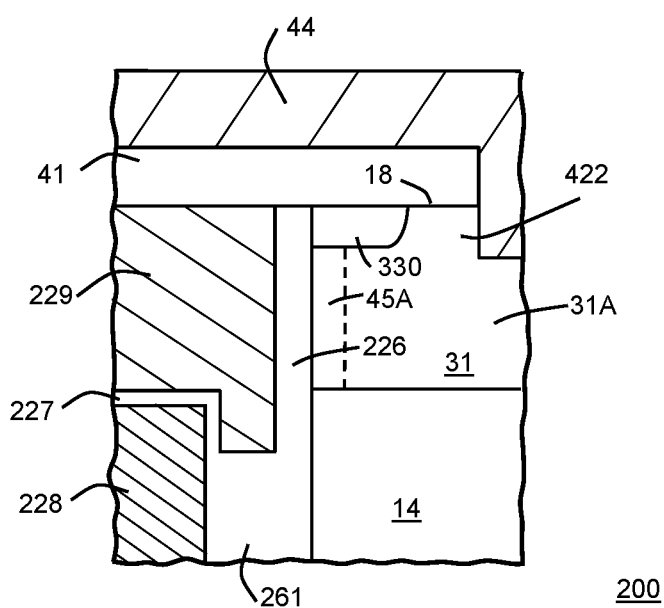
FIG. 11 illustrates a partial cross-sectional view of the semiconductor device of FIG. 7 taken along reference line 11'-11'.
Figure 12:
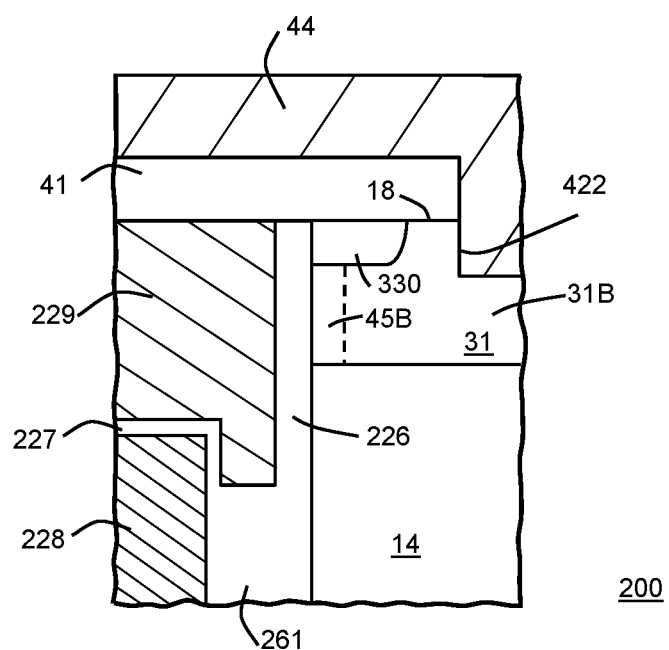
FIG. 12 illustrates a partial cross-sectional view of the semiconductor device of FIG. 7 taken along reference line 12'-12'.

FIG. 7 illustrates a partial top plan view of an electronic device 200, semiconductor device structure 200, or semiconductor device 200 in accordance with an example of the present description. FIG. 8 illustrates a partial cross-sectional view of semiconductor device 200 taken along reference line 8-8 of FIG. 7, FIG. 9 illustrates a partial cross-sectional view of semiconductor device 200 taken along reference line 9-9 of FIG. 7, FIG. 10 illustrates a partial cross-sectional view of semiconductor device 200 taken along reference line 10-10 of FIG. 7, FIG. 11 illustrates a partial cross-sectional view of semiconductor device 200 taken along reference line 11'-11' of FIG. 7, and FIG. 12 illustrates a partial cross-sectional view of semiconductor device 200 taken along reference line 12'-12' of FIG. 7. Semiconductor device 200 is similar to semiconductor device 100 and only the differences will be described in detail hereinafter.

In accordance with the present description, adjoining source regions 33 within columns 200A, 200B, and 200C illustrated in FIG. 7 are connected or interconnected electrically with source ballast resistor structures 330 or ballast resistors 330. That is, in semiconductor device 200, the source structures are segmented and include a source region 33 and a connecting ballast resistor 330. In some examples, ballast resistors 330 comprise diffused regions disposed within body regions 31 and comprise an N-type conductivity dopant.

In the present example, source regions 33 are denoted using lighter grey-shading in FIG. 7. Ballast resistors 330 are denoted using darker grey-shading in FIG. 7. In accordance with the present example, source regions 33 are disposed within and are shielded by first segments 31A or higher concentration regions 31A of doped regions 31. In some examples, ballast resistors 330 extend to laterally overlap a portion of first segments 31A where ballast resistors 330 connect to or contact source regions 33, and laterally extend across second segments 31B or lower concentration regions 31B of doped region 31 as generally illustrated in FIGS. 7 and 8. In some examples, source regions 33 in a first column (e.g., column 200A) are offset or staggered with respect to source regions 33 in adjacent column (e.g., column 200B), which was found unexpectedly to help reduce the impact of the shielded source configuration on on-resistance for semiconductor device 200.

As illustrated in FIG. 7, the lateral width of ballast resistors 330 is less than the lateral width of source regions 33. In this way, ballast resistors are laterally separated or laterally spaced apart from contact trenches 422 so that conductive layer 44 does not directly physically contact ballast resistors 330. Instead, a portion of first segment 31A and second segment 31B is laterally interposed between conductive layer 44 and ballast resistor 330 as generally illustrated in FIGS. 7, 11, and 12. In the present example, conductive layer 44 only electrically contacts source regions 33 through contact trenches 442 as generally illustrated in FIG. 10.

Similar to semiconductor device 100, the threshold voltage of second segments 31B is lower than the threshold voltage of first segments 31A. Thus, at a selected gate voltage $V_G$ below the threshold voltage of first segments 31A, channel regions 45B form first in second segments 31B, and device current flows vertically within second segments 31B and then laterally through ballast resistors 330 to source regions 33 in the linear mode of operation. Similar to semiconductor device 100, device current does not flow vertically within first segments 31A while the selected gate voltage $V_G$ is below the threshold voltage of first segments 31A so that first segments 31A function to shield source regions 33 and prevent any vertical current flow directly to source regions 33. During the linear mode of operation, ballast resistors 330 are configured to control the amount of current flow so that as junction temperature increases, the resistance of ballast resistors 330 increases thereby controlling or limiting current flow in semiconductor device 200. In this way, a negative feedback effect is provided thereby reducing the likelihood of thermal runaway during the linear mode of operation as observed in prior devices.

Similar to semiconductor device 100, when semiconductor device 200 is operating in the fully-on mode of operation (i.e., $V_G$ equals the $V_T$ of first segments 31A) channels 45A in first segments 31A of body region 31 are formed and can contribute to current flow thereby reducing any higher on-resistance effects exhibited before channels 45A are formed. Since semiconductor device 200 uses N-type diffused resistor structures in the present example, semiconductor device 200 exhibits a lower on-resistance compared to semiconductor device 100. In some examples, this facilitates source regions 33 in semiconductor device 200 requiring less contact area compared to semiconductor device 100.

Figure 13:
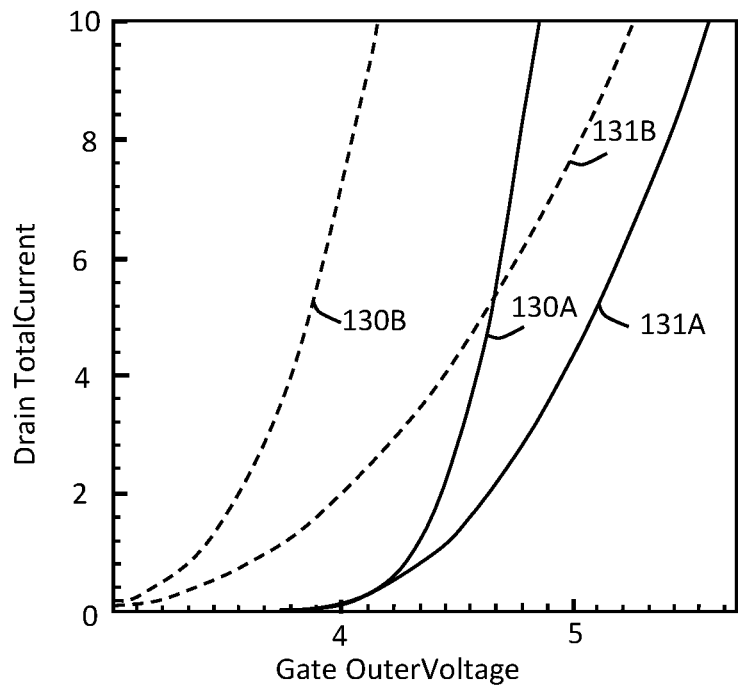
FIG. 13 is a graph illustrating parametric data for a semiconductor device of the present description compared to a related semiconductor device.

FIG. 13 is a graph illustrating total drain current versus gate over-voltage at about 25 Degrees Celsius and about 155 Degrees Celsius comparing semiconductor device 100 of the present description to a prior MOSFET device having a continuous source region stripe. Curve 130A is the prior MOSFET device at 25 Degrees Celsius, curve 130B is the prior MOSFET device at 155 Degrees Celsius, curve 131A is semiconductor device 100 at 25 Degrees Celsius, and curve 131B is semiconductor device 100 at 155 at 155 Degrees Celsius. In this analysis, the drain voltage $V_D$ was 50 volts. As shown in FIG. 13, semiconductor device 100 having shielded source regions 33 has much less of a delta current increase at higher temperature compared to the prior MOSFET device. More particularly, this illustrates that semiconductor device 100 suppresses the positive feedback effect found in the prior MOSFET device where current flow increases more dramatically as temperature increases. This provides semiconductor device 100 with improved thermal stability compared to the prior MOSFET device.

Figure 14:
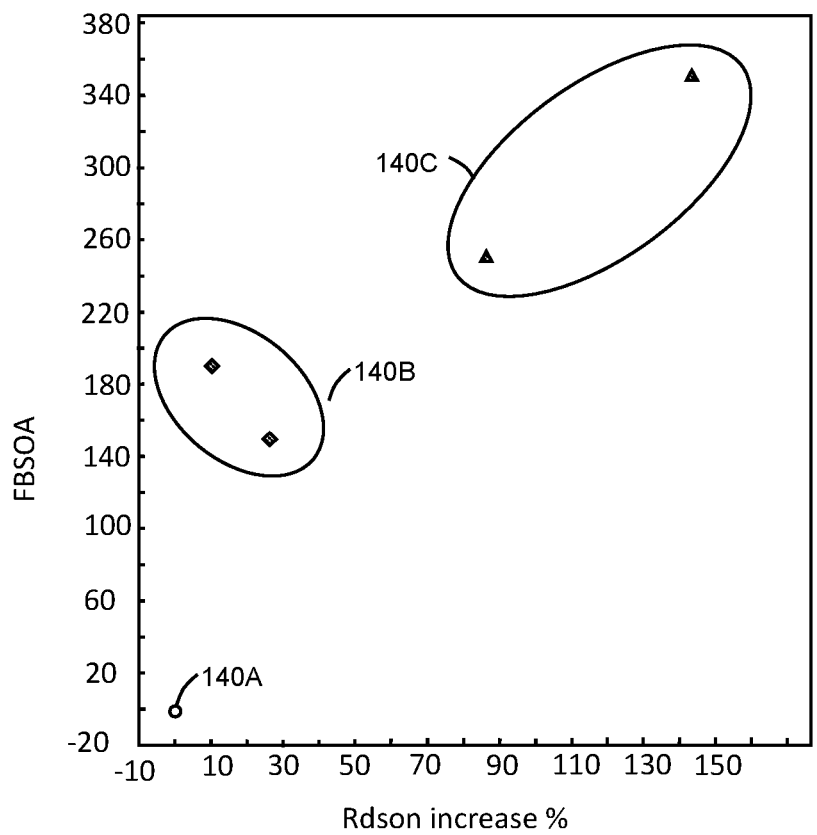
FIG. 14 is a graph illustrating further parametric data for a semiconductor device of the present description compared to a related semiconductor device.

FIG. 14 is a graph illustrating the amount of increase in forward-biased SOA (FBSOA) in percentage (%) compared to the trade-off increase in on-resistance (Rdson) in percentage (%). Data point 140A represents the prior MOSFET device described previously, data set 140B is for an example semiconductor device 200, and data set 140C is for an example semiconductor device 100. These results illustrate that an example of semiconductor device 200 exhibits about a 150% to about 190% increase in FBSOA while only exhibiting about a 5% to about 20% increase in on-resistance compared to the prior MOSFET device. In addition, these results illustrate that an example of semiconductor device 100 exhibits about a 250% to about 350% increase in FBSOA while exhibiting about an 85% to about 145% increase in on-resistance compared to the prior MOSFET device. This data also shows that semiconductor device 200 has better on-resistance performance than semiconductor device 100, but that semiconductor device 100 has better FBSOA performance than semiconductor 200.

Semiconductor devices 100 and 200 are suitable for power applications where, among other things, improved FBSOA performance is important and the associated increase in on-resistance is acceptable. Such applications include, but are not limited to hot swap applications.

In view of all the above, it is evident that a novel method and structure are disclosed. Specifically, a structure and method is provided where during linear mode of operation the channel current is configured to flow only in certain segments of the device. In some examples, the structure comprises a source region of a first conductivity type having a first segment bounded underneath by a first segment of well region of a second conductivity type. In some examples, the first segment of the source region is laterally bounded by a second segment of the well region where the dopant concentration of the second segment of the well region is less than the dopant concentration of the first segment of the well region. In operation, the second segment of the well region has a lower threshold voltage $V_T$ then the first segment of the well region and turns on first facilitating the lateral and vertical current flow in the device. During the linear mode of operation, a channel is not formed in the first segment of the well region, which functions to shield the first segment of the source region from vertical current flow to reduce the likelihood of thermal runaway.

In some examples, a second segment of the source region is configured to provide a series ballast resistance to provide a negative feedback between current and junction temperature in the linear mode of operation (i.e., as temperature increases the series resistance increases thereby reducing current through the ballast resistor portion of the source region), which improves current uniformity across the device thus improving the forward-biased safe operating area (FBSOA). In addition, the first segment of the well region having the increased dopant concentration functions to improve on-resistance when the device is in a fully-on condition. In one embodiment, the device can include all of the above described features. In another embodiment, the device can include at least one of the described features. In a further embodiment, the device can include at least two of the described features. In a further embodiment, the device can include at least three of the described features. In a still further embodiment, the device can include at least four of the described features.

While the subject matter of the invention is described with specific preferred embodiments and example embodiments, the foregoing drawings and descriptions thereof depict only typical embodiments of the subject matter and are not therefore to be considered limiting of its scope. It is evident that many alternatives and variations will be apparent to those skilled in the art. For example, the subject matter has been described for a particular n-channel MOSFET structure with trench shielded gate strictures, although the method and structure is directly applicable to other MOS transistors, such as non-shielded MOS transistors and planar gate MOS transistors, as wells as bipolar, BiCMOS, metal semiconductor FETs (MESFETs), HFETs, thyristors bi-directional transistors, and other transistor structures.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments, as would be understood by those skilled in the art.

What is claimed is:

1. A semiconductor device structure, comprising:
   a region of semiconductor material comprising a first semiconductor layer of a first conductivity type and having a first major surface;
   a first body region of a second conductivity type opposite to the first conductivity type disposed in the first semiconductor layer extending from the first major surface, wherein the first body region comprises:
      a first segment having a first doping concentration; and
      a second segment laterally adjacent to the first segment and adjacent to the first major surface having a second doping concentration less than the first doping concentration;
   a first source region of the first conductivity type disposed in the first segment of the body region but not disposed in at least a portion of the second segment;
   an insulated gate electrode disposed adjacent to the region of semiconductor material adjoining the first segment and configured to provide a first channel region in the first segment, adjoining the second segment and configured to provide a second channel region in the second segment, and adjoining the first source region;
   a first conductive layer electrically connected to the first segment, the second segment, and the first source region; and
   a second conductive layer adjacent to a second major surface of the region of semiconductor material opposite to the first major surface.

2. The semiconductor device structure of claim 1, further comprising:
   a ballast resistor structure electrically connected to the first source region, wherein the ballast resistor structure does not physically contact the first conductive layer.

3. The semiconductor device structure of claim 2, wherein:
   the ballast resistor structure comprises a doped region of the first conductivity type disposed within the first body region; and
   the doped region is disposed within the second segment and laterally extends to overlap a portion of the first segment.

4. The semiconductor device structure of claim 1, wherein:
   the first segment extends into the first semiconductor layer to a first depth; and
   the second segment extends into the first semiconductor layer to a second depth.

5. The semiconductor device structure of claim 4, wherein:
the first depth is greater than the second depth.

6. The semiconductor device structure of claim 1, wherein:
the first body region comprises a first stripe region; and
the semiconductor device structure further comprises:
a second body region comprising:
a second stripe region generally parallel to the first stripe region;
a second body region first segment having the first doping concentration; and
a second body region second segment having the second doping concentration; and
a second source region of the first conductivity type disposed within the second body region first segment and laterally offset with respect to the first source region.

7. The semiconductor device structure of claim 6, wherein:
the first segment of the first body region has a first width; and
the second body region first segment has a second width different than the first width.

8. The semiconductor device structure of claim 7, wherein:
the second width is less than the first width.

9. The semiconductor device structure of claim 1, wherein:
the first body region comprises a third segment laterally interposed between the first segment and the second segment;
the third segment comprises a third doping concentration between the first doping concentration and the second doping concentration; and
the first source region laterally extends into at least a portion of the third segment.

10. The semiconductor device structure of claim 1, wherein:
the first doping concentration has a first peak dopant concentration;
the second doping concentration has a second peak dopant concentration; and
the first peak dopant concentration is about twice the second peak dopant concentration.

11. A semiconductor device structure, comprising:
a region of semiconductor material comprising a first semiconductor layer of a first conductivity type and having a first major surface;
a first body region of a second conductivity type opposite to the first conductivity type disposed in the first semiconductor layer extending from the first major surface, wherein the first body region comprises:
a first body region first segment having a first doping concentration; and
a first body region second segment laterally adjacent to the first body region first segment and adjacent to the first major surface having a second doping concentration less than the first doping concentration;
a first source region of the first conductivity type disposed in the first body region first segment but not disposed in at least a portion of the first body region second segment;
an insulated gate electrode disposed adjacent to the region of semiconductor material adjoining the first body region first segment, the first body region second segment, and the first source region;
a first conductive layer disposed in a contact trench and electrically connected to the first body region first segment, the first body region second segment, and the first source region; and
a ballast resistor structure electrically connected to the first source region, wherein the ballast resistor structure does not physically contact the first conductive layer.

12. The semiconductor device structure of claim 11, wherein the ballast resistor structure comprises:
a doped region of the first conductivity type disposed within the first body region second segment and laterally extends to overlap a portion of the first body region first segment.

13. The semiconductor device structure of claim 11, wherein:
the first body region first segment extends into the first semiconductor layer to a first depth; and
the first body region second segment extends into the first semiconductor layer to a second depth that is different than the first depth.

14. The semiconductor device structure of claim 11, wherein:
the first body region comprises a first stripe region; and
the semiconductor device structure further comprises:
a second body region comprising:
a second stripe region generally parallel to the first stripe region;
a second body region first segment having the first doping concentration; and
a second body region second segment having the second doped concentration; and
a second source region of the first conductivity type disposed within the second body region first segment and laterally offset with respect to the first source region.

15. The semiconductor device structure of claim 14, wherein:
the first body region first segment has a first width; and
the second body region first segment has a second width different than the first width.

16. The semiconductor device structure of claim 11, wherein:
the first doping concentration has a first peak dopant concentration;
the second doping concentration has a second peak dopant concentration; and
the first peak dopant concentration is about twice the second peak dopant concentration.

17. A method of forming a semiconductor device structure, comprising:
providing a region of semiconductor material comprising a first semiconductor layer of a first conductivity type and having a first major surface;
providing a first body region of a second conductivity type opposite to the first conductivity type disposed in the first semiconductor layer extending from the first major surface, wherein the first body region comprises:
a first body region first segment having a first doping concentration; and
a first body region second segment laterally adjacent to the first body region first segment and adjacent to the first major surface having a second doping concentration less than the first doping concentration;
providing a first source region of the first conductivity type disposed in the first body region first segment but not disposed in at least a portion of the first body region second segment;

providing an insulated gate electrode disposed within the region of semiconductor material adjoining the first body region first segment and configured to provide a first channel region in the first segment, adjoining the first body region second segment and configured to provide a second channel region in the second segment, and adjoining the first source region; and providing a first conductive layer disposed in a contact trench and electrically connected to the first body region first segment, the first body region second segment, and the first source region.

18. The method of claim 17, further comprising:

providing a ballast resistor structure electrically connected to the first source region, wherein:

the ballast resistor structure does not physically contact the first conductive layer; and the ballast resistor structure comprises:
- a doped region of the first conductivity type disposed within the first body region second segment and laterally extends to overlap a portion of the first body region first segment.

19. The method of claim 17, wherein:

providing the first body region comprises a providing first stripe region; and the method further comprises:
  providing a second body region comprising:
    a second stripe region generally parallel to the first stripe region;
    a second body region first segment having the first doping concentration; and
    a second body region second segment having the second doped concentration; and
  providing a second source region of the first conductivity type disposed within the second body region first segment and laterally offset with respect to the first source region.

20. The method of claim 19, wherein:

providing the first body region comprises providing the first body region first segment having a first width; and providing the second body region comprises providing the second body region first segment having a second width different than the first width.

* * * * *